(12) United States Patent
Ferguson et al.

(10) Patent No.: US 10,379,589 B2
(45) Date of Patent: Aug. 13, 2019

(54) POWER CONTROLS (71) Applicant: Hewlett-Packard Development Company, L.P., Houston, TX (US)

(72) Inventors: Patrick Ferguson, Taipei (TW); Chien-Hao Lu, Taipei (TW); Chih Liang Li, Taipei (TW); Szu Tao Tong, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 255 days.

(21) Appl. No.: 15/306,674

(22) PCT Filed: Apr. 29, 2014

(86) PCT No.: PCT/US2014/035874
§ 371 (c)(1),
(2) Date: Oct. 25, 2016

(87) PCT Pub. No.: WO2015/167459
PCT Pub. Date: Nov. 5, 2015

(65) Prior Publication Data
US 2017/0060210 A1    Mar. 2, 2017

(51) Int. Cl.
*G06F 1/26*      (2006.01)
*G06F 1/30*      (2006.01)
(Continued)

(52) U.S. Cl.
CPC ............ *G06F 1/266* (2013.01); *G06F 1/30* (2013.01); *G06F 1/3296* (2013.01); *G11C 16/30* (2013.01)

(58) Field of Classification Search
CPC . G06F 1/263; G06F 1/266; G06F 1/30; G06F 1/3296; G11C 16/30
See application file for complete search history.

(56) References Cited

U.S. PATENT DOCUMENTS

| 6,198,176 B1 | 3/2001 | Gillette |
| 6,201,319 B1 | 3/2001 | Simonelli et al. |

(Continued)

FOREIGN PATENT DOCUMENTS

| CN | 202159301 U | 3/2012 |
| CN | 202795218 U | 3/2013 |

(Continued)

OTHER PUBLICATIONS

"Internal UPS for Desktop Computers?," Super User, Stack Exchange, Inc., May 20, 2011, pp. 1-2, <superuser.com/questions>.

*Primary Examiner* — Terrell S Johnson
(74) *Attorney, Agent, or Firm* — HP Inc. Patent Department (57) ABSTRACT

An example disclosed herein is a non-volatile storage medium including instructions relating to control of power that, when executed by a processor, cause the processor to monitor a supply of power to a regulator, decouple supply of power to the regulator when the monitored supply of power is below a predetermined level, couple a power pack to the regulator to supply power to the regulator when the monitored supply of power is below the predetermined level, and generate an Advanced Configuration and Power Interface (ACPI) G1 Sleeping state signal when the monitored supply of power is below the predetermined level.

15 Claims, 8 Drawing Sheets

(51) Int. Cl.
*G11C 16/30* (2006.01)
*G06F 1/3296* (2019.01)

(56) References Cited

U.S. PATENT DOCUMENTS

| | | | |
|---|---|---|---|
| 7,872,374 B2 | 1/2011 | Gottlieb et al. | |
| 7,948,293 B1 * | 5/2011 | Edwards | G06F 1/263 327/333 |
| 8,581,449 B2 * | 11/2013 | Tupman | H02J 7/0054 307/126 |
| 2001/0011845 A1 * | 8/2001 | Simonelli | H02J 9/062 307/66 |
| 2003/0085621 A1 * | 5/2003 | Potega | B60L 11/185 307/18 |
| 2008/0278006 A1 * | 11/2008 | Gottlieb | G01R 31/3648 307/66 |
| 2011/0131427 A1 * | 6/2011 | Jorgenson | G06F 1/26 713/300 |
| 2011/0305049 A1 | 12/2011 | Raptis et al. | |
| 2017/0269659 A1 * | 9/2017 | Chen | G06F 1/24 |

FOREIGN PATENT DOCUMENTS

| | | |
|---|---|---|
| JP | 2005-071820 A | 3/2005 |
| KR | 10-2012-0079510 A | 7/2012 |
| TW | I307009 | 3/2009 |
| TW | I345349 | 7/2011 |
| TW | 201447551 A | 12/2014 |

* cited by examiner

POWER CONTROLS

BACKGROUND

Consumers appreciate reliability in their electronic devices. They also appreciate cost-effective solutions to challenges they may face in their use of such electronic devices. Designers and manufactures of these electronic devices may, therefore, endeavor to create and supply solutions that are directed to accomplishing these objectives.

BRIEF DESCRIPTION OF THE DRAWINGS

The following detailed description references the drawings, wherein.

DETAILED DESCRIPTION

Electronic devices (e.g., desktop computers) may be connected to a source of alternating current (AC) power such as an AC wall outlet. This arrangement can result in a loss of power to an electronic device due to, for example, a power outage at the AC wall outlet or the accidental disconnection of a power cord from the AC wall outlet. This, in turn, causes the electronic device to unexpectedly shut down which can result in a corruption of and/or loss of data that has yet to be saved to a hard disk or flash drive.

An uninterruptable power supply (UPS) may be used to supply continuous power to an electronic device is situations where alternating current power is lost from an AC wall outlet. However, uninterruptable power supplies can be expensive and large in size. Accordingly, same consumers may find the use of such uninterruptable power supplies to be undesirable due to this relatively high cost and the space constraints under which they may be already operating. Additionally at least some consumers may be primarily concerned that their data not be corrupted or lost as the result of an alternating current power outage, rather than being able to continuously use their electronic device until such alternating current power is restored.

Notwithstanding this, consumers may still want to be able to prepare for situations where their use of such electronic devices may be interrupted due to a loss of alternating current power from an AC wall outlet. Examples directed to addressing these challenges are illustrated in FIGs.1-9.

As used herein, the term "nonvolatile storage medium" represents any medium that can contain, store, retain, or maintain programs, code, scripts, information, and/or data. A non-volatile storage medium may include any one of many physical media such as, for example, electronic, magnetic, optical, electromagnetic, or semiconductor media. A non-volatile storage medium may be a component of a distributed system. More specific examples of suitable non-volatile storage media include, but are not limited to, a magnetic computer diskette such as floppy diskettes or hard drives, magnetic tape, a read-only memory (ROM), an erasable programmable read-only memory (EPROM), a flash drive or memory, a compact disc (CD), a digital video disk (DVD), or a memristor.

As used herein, the term "processor" represents an instruction execution system such as a computer-based system, an Application Specific integrated Circuit (ASIC), a computing device, a hardware and/or machine readable instruction system, or any combination thereof, that can fetch or obtain the logic from a non-volatile storage medium and execute the instructions contained thereon. "Processor" can also include any controller, state-machine, microprocessor, logic control circuitry, cloud-based utility, service or feature, any other analogue, digital and/or mechanical implementation thereof, or any combination of the forgoing. A processor may be a component of a distributed system.

As used herein, the term "distributed system" represents multiple processors and non-volatile storage media in different locations or systems that communicate via a network, such as the cloud. As used herein, the term "cloud" represents computing resources (hardware and/or machine readable instructions) that are delivered as a service over a network (such as the internet).

As used herein, the term "circuit" represents an interconnection of elements such as resistors, inductors, capacitors, voltage sources, current sources, transistors, diodes, application specific integrated circuits (ASICs), processors, controllers, switches, transformers, gates, timers, relays, multiplexors, connectors, comparators, amplifiers, filters, and/or modules having these elements that allow operations to be performed such as signal amplification, filtering or modification, computations, regulation, rectification, selection, modulation, or multiplexing. A circuit may utilize constant, alternating, continuous, or discrete signals, as well as any combination thereof.

As used herein the term. Advanced Configuration and Power interface (ACPI) represents an open industry specification for electronic device configuration and power management by an operating system. The ACPI specification defines the following, four global "Gx" states and six sleep "Sx" states for an ACPI-compliant computer system:

G0 (S0), Working: "Awaymode" is a subset of S0, where monitor is off but background tasks are running.
G1, Sleeping: Divided into four states, S1 through S4:
   S1, Power on Suspend (POS): All the processor caches are flushed, and the central processing unit (CPU) stops executing instructions. The power to the CPU and random access memory (RAM) is maintained. Devices that do not indicate they need to remain on may be powered off.
   S2: CPU powered off. Dirty cache is flushed to RAM.
   S3, commonly referred to as Standby, Sleep, or Suspend to RAM (STR): RAM remains powered.
   S4, Hibernation or Suspend to Disk: All content of the main memory is saved to non-volatile memory, such as a hard drive, and is powered down.
G2 (S5), Soft Off: G2/S5 is almost the same as G3 Mechanical Off, except that the power supply unit still supplies power, at a minimum, to the power button to allow return to S0. No previous content is retained. Other components may remain powered so the computer can "wake" on input from a keyboard, clock, modem, local area network (LAN), or universal serial bus (USB) device.
G3, Mechanical Off: The power to a computer has been totally removed in a mechanical switch. The power cord can be removed and the system is safe for disassembly (typically, the real-time clock continues to run—using its own battery).

Figure 1:
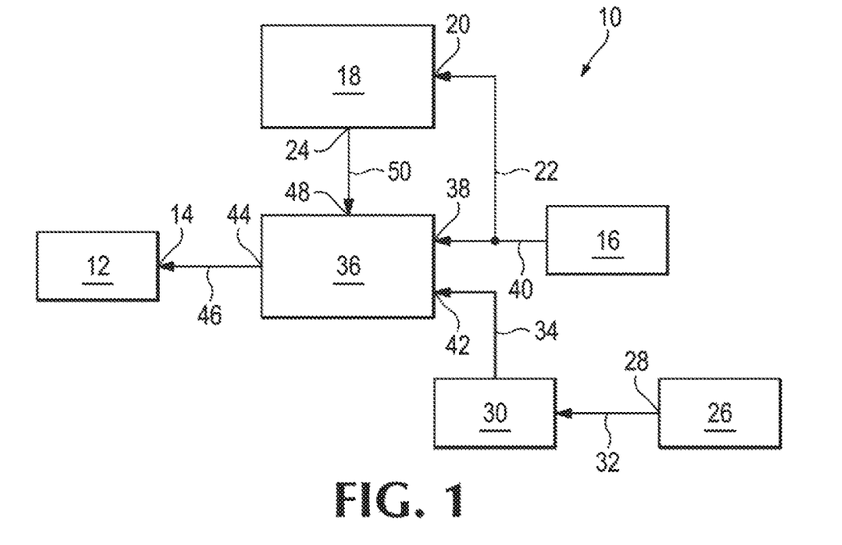
FIG. 1 is an example of a power control circuit.

An example of a power control circuit 10 is shown in FIG. 1. As can be seen in FIG. 1, power control circuit 10 includes a regulator 12 leaving an input 14 and a power supply 16 which may include an AC wall outlet and a power plug. Power control circuit 10 also includes a power monitor 18 baying an input 20 coupled to power supply 16, as indicated by arrow 22, and an output 24. Power control circuit 10 additionally includes a power pack 26 having an output 28 and a flow control module 30 having a first state to couple power pad output 28 to regulator input 14, as indicated by arrows 32 and 34. Power pack 26 provides an alternative to the use of a relatively more expensive and larger uninterruptable power supply (UPS). Power control circuit 10 further includes a power source selector 36 having a first input 38 coupled to power supply 16, as indicated by arrow 40, a second input 42 coupled to power pack output 28 via flow control module 30, an output 44 coupled to regulator input 14, as indicated by arrow 46, and a control input 48 coupled to power monitor output 24, as indicated by arrow 50, to selectively couple either power supply 16 to regulator input 14 via first input 38 and power source selector output 44 or power pack output 28 to regulator input 14 via second input 42 and power source selector output 44.

Figure 2:
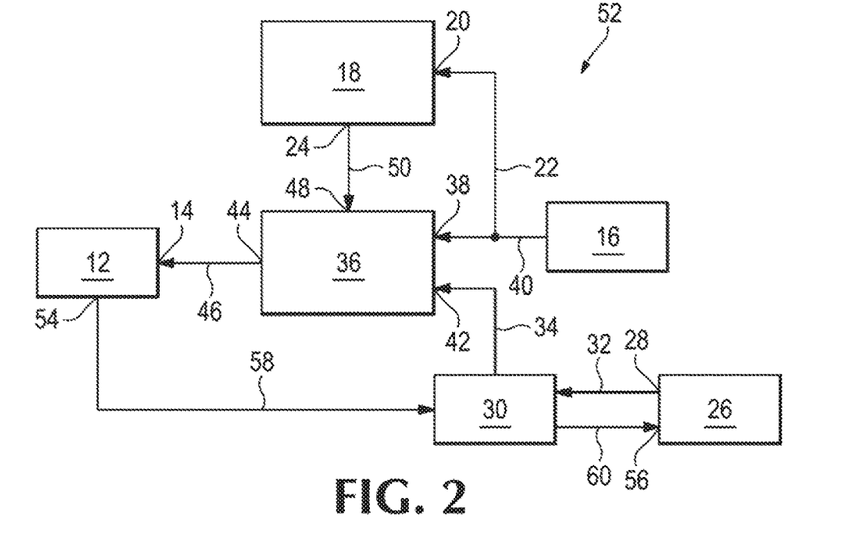
FIG. 2 is another example of a power control circuit.

Another example of a power control circuit 52 is shown in FIG. 2. Where possible, the same reference numerals have been used for the elements of power control circuit 52 that are the same as the elements of power control circuit 10 of FIG. 1. As can be seen in FIG. 2, regulator 12 of power control circuit 52 additionally includes an output 54 and power pack 26 includes an input 56. Flow control module 30 of power control circuit 52 includes a second state to couple regulator output 54 to power pack input 56, as indicated by arrows 58 and 60.

Figure 3:
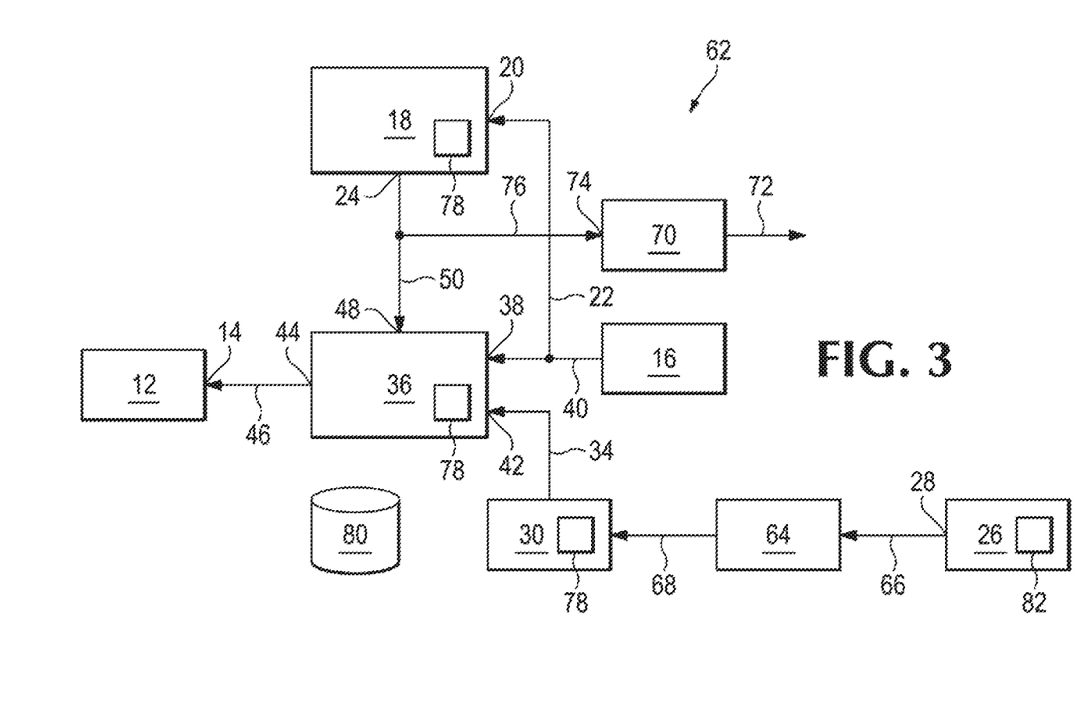
FIG. 3 is a further example of a power control circuit.

Another example of a power control circuit 62 is shown in FIG. 3. Where possible, the same reference numerals have been used fear the elements of power control circuit 62 that are the same as the elements of power control circuit 10 of FIG. 1 and power control circuit 52 of FIG. 2. As can be seen in FIG. 3, power control circuit 62 includes a connector 64 to removably couple power pack output 28 to flow control module 30, as indicated by arrows 66 and 68. Connector 64 may include a universal serial bus connector (either type A or type B). Connector 64 allows power pack 26 to easy couple to and decouple from snow control module 30 by utilizing readily available standard interfaces rather than specially designed and potentially more expensive custom interfaces. As can also be seen in FIG. 3, power control circuit 62 also includes an event generator 70 that has an Advanced Configuration and Power Interface (ACPI) G1 Sleeping state output 72 and an input 74 coupled to power monitor output 24, as indicated by arrow 76.

At least one of power monitor 18, flow control module 30, and power source selector 36 include a processor 78. Power control circuit 62 additionally includes a non-volatile storage medium 80 having instructions relating to control of power that arc executable by processor 78. As can be seen in FIG. 3, in this example of power control circuit 62, non-volatile storage medium 80 is separate from power monitor 18, flow control module 30, and power source selector 36. It is to be understood, however, that in other examples of power control circuit 62, non-volatile storage medium 80 may be part of power monitor 18, flow control module 30 and/or power source selector 36. As can additionally be seen in FIG. 3, power pack 26 includes a rechargeable battery 82.

Figure 4:
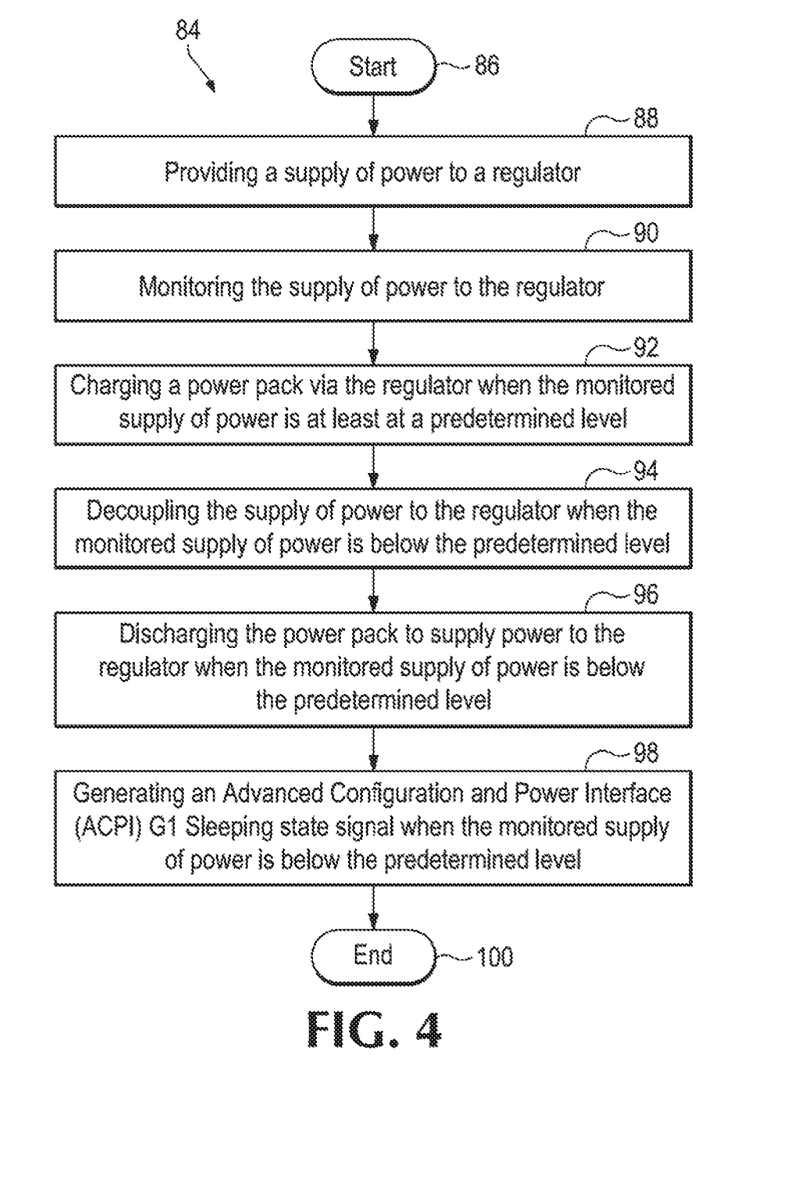
FIG. 4 is an example of a method of controlling power.

An example of a method of controlling power 84 is shown in FIG. 4. As can be seen in FIG. 4, method of controlling power 84 starts 86 by providing a supply of power to a regulator, as indicated by block 88, and monitoring the supply of power to the regulator, as indicated by block 90. Method of controlling power 84 continues by charging a power pack via the regulator when the monitored supply of power is at least at a predetermined level, as indicated by block 92, and decoupling, the supply of power to the regulator when the monitored supply of power is below the predetermined level, as indicated by block 94. Method of controlling power 84 further continues by discharging the power pack to supply power to the regulator when the monitored supply of power is below the predetermined level, as indicated by block 96, and generating an Advanced Configuration and Power Interface (ACPI) G1 Sleeping state signal when the monitored supply of power is below the predetermined level, as indicated by block 98. Method of controlling power 84 may then end 100.

Figure 5:
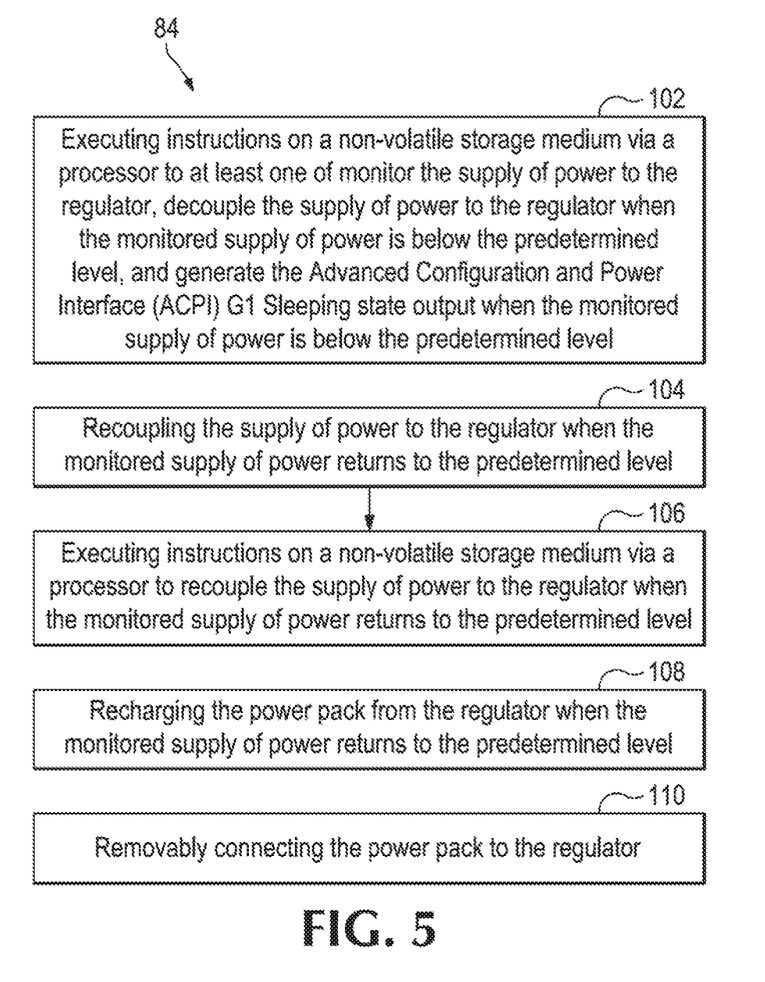
FIG. 5 is an example of additional elements of the method of controlling power of FIG. 4.

An example of additional elements of the method of controlling power 84 of FIG, 4 is shown in FIG. 5. As can be seen in FIG. 5, method of controlling power 84 may additionally include executing instructions on a non-volatile storage medium via a processor to at least one of monitor the supply of power to the regulator, decouple the supply of power to the regulator when the monitored supply of power is below the predetermined level, and generate the Advanced Configuration and Power Interface (ACPI) G1 Sleeping state output when the monitored supply of power is below the predetermined level, as indicated by block 102.

As can also be seen in FIG. 5, method of controlling power 84 may include recouping the supply of power to the regulator when the monitored supply of power returns to the predetermined level, as indicated by block 104. In such cases, method of controlling power 84 may additionally include executing instructions on a non-volatile storage medium via a processor to recouple the supply of power to the regulator when the monitored supply of power returns to the predetermined level, as indicated by block 106.

As can further be seen in FIG. 5, method of controlling power 84 may include recharging the power pack from the regulator when the monitored supply of power returns to the predetermined level, as indicated by block 108. Additionally or alternatively, method of controlling power 84 may include removably connecting the power pack to the regulator, as indicated by block 110.

Figure 6:
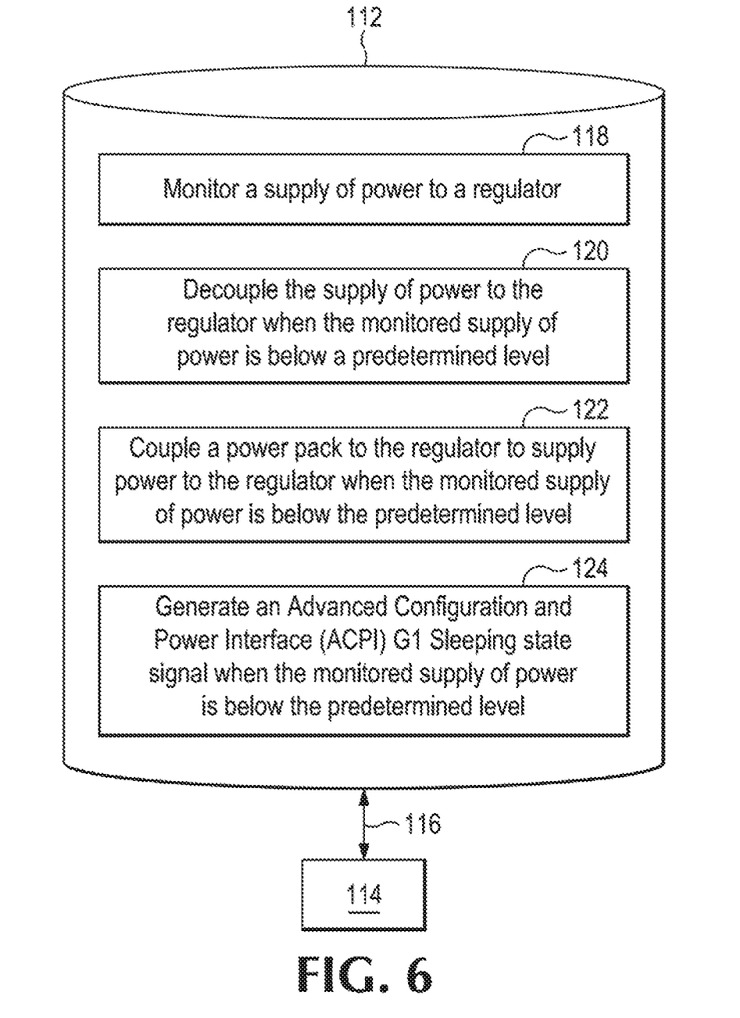
FIG. 6 is an example of a non-volatile storage medium having instructions executable by a processor.

An example of a non-volatile storage medium 112 having instructions executable by a processor 114, as indicated by doubled-headed arrow 116, is shown in FIG. 6. As can be seen in FIG. 6, non-volatile storage medium 112 includes instructions that, when executed by processor 114, cause the processor 114 to monitor a supply of power to a regulator, as indicated by block 118, and decouple the supply of power to the regulator when the monitored supply of power is below a predetermined level, as indicated by block 120. Non-volatile storage medium 112 includes additional instructions that when executed by processor 114, cause the processor 114 to couple a power pack to the regulator to supply power to the regulator when the monitored supply of power is below the predetermined level, as indicated by block 122, and generate an Advanced Configuration and Power Interface (ACPI) G1 Sleeping state signal when the monitored supply of power is below the predetermined level, as indicated by block 124.

Figure 7:
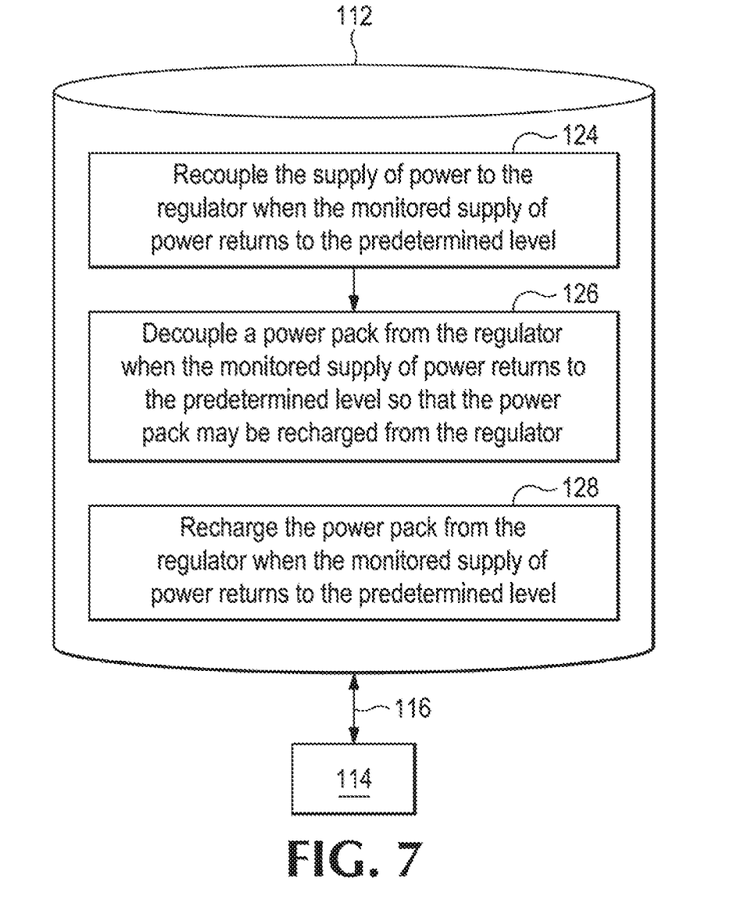
FIG. 7 is an example of the non-volatile storage medium of FIG. 6 including additional instructions executable by the processor.

An example of non-volatile storage medium 112 including additional instructions executable by the processor 114, as generally indicated by double-headed arrow 116, is shown in FIG. 7. As can be seen in FIG. 7, non-volatile storage medium 112 may include additional instructions that, when executed by processor 114, cause processor 114 to recouple the supply of power to the regulator when the monitored supply of power returns to the predetermined level, as indicated by block 124, and decouple a power pack from the regulator when the monitored supply of power returns to the predetermined level so that the power pack may be recharged from the regulator, as indicated by block 126. Non-volatile storage medium 112 may include additional instructions that, when executed by processor 114, cause processor 114 to recharge the power pack from the regulator when the monitored supply of power returns to the predetermined level, as indicated by block 128.

Figure 8:
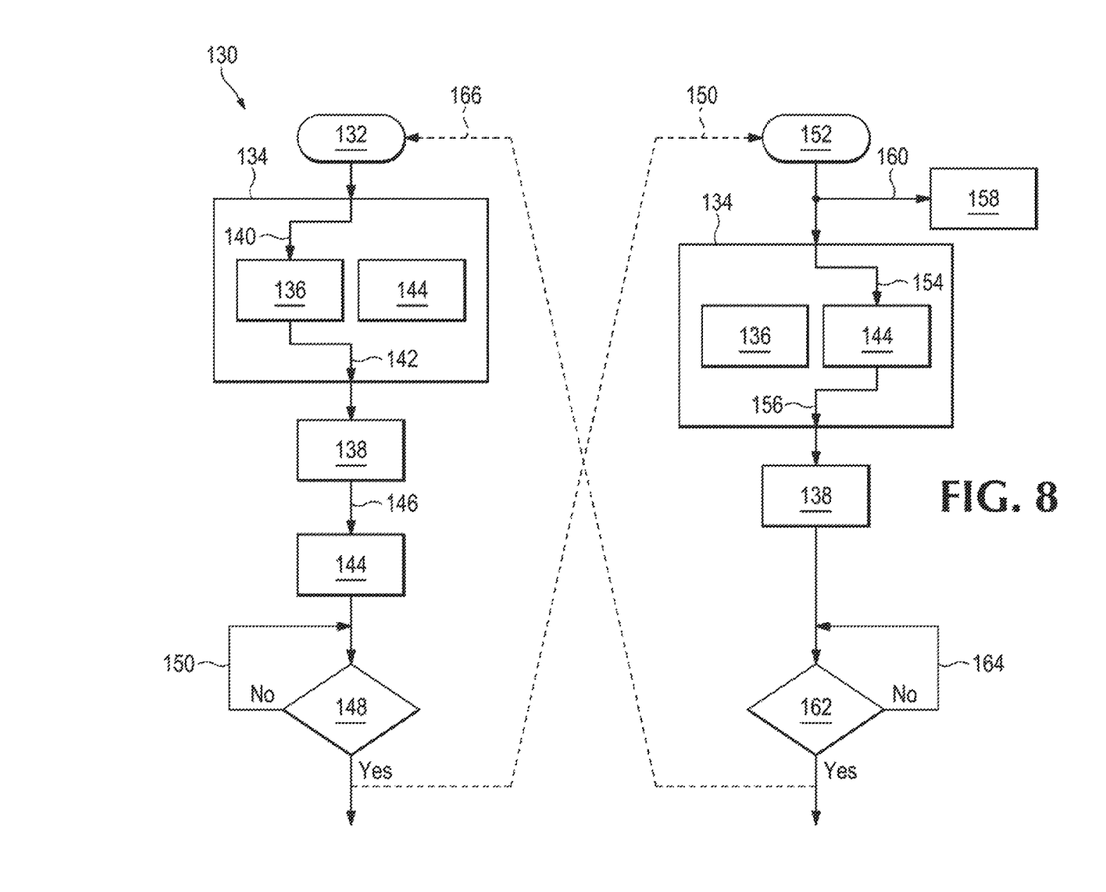
FIG. 8 is an example of a power control flow diagram.

An example of a power control flow diagram 130 is shown in FIG. 8. Power control flow diagram 130 may be used to provide an example of the operation of power control circuit 10, power control circuit 52, power control circuit 62 and/or method of controlling power 84, as well as the execution of instructions included on non-volatile storage medium 112 by processor 114. As can be seen in FIG. 8, power control flow diagram 130 has a state 132 that monitors a power supply 136 to verify that power supply 136 is at least at a predetermined level. If power supply 136 is at least at this predetermined level, then a power source selector 134 selectively couples power supply 136 to a regulator 138, as indicated by arrows 140 and 142. Additionally, if power supply 136 is at least at the predetermined level, then a power pack 144 is recharged from regulator 138, as indicated by arrow 146. Power pack 144 provides an alternative to the use of a relatively more expensive and larger uninterruptable power supply (UPS).

As can be seen in FIG. 8, power control flow diagram 130 monitors whether power supply 136 is below the predetermined level 148. If it isn't, then no additional action is taken, as indicated by arrow 150, if power supply 136 has fallen below the predetermined level 148, then power control flow diagram 130 branches to state 152 which indicates a power supply 136 loss. Upon the occurrence of this condition, power source selector 134 selectively decouples power supply 136 from regulator 138 and couples power pack 144 to regulator 138, as indicated by arrows 154 and 156 to discharge power pack 144 to supply power to regulator 138. Power control flow diagram 130 also has an event generator 158 generate an Advanced Configuration and Power Interface (ACM) G1 Sleeping state signal, indicated by arrow 160.

As can be seen in FIG. 8, in this condition, power control flow diagram 130 monitors whether power supply 136 has returned to at least at the predetermined level 162. If it hasn't, then no additional action is taken, as indicated by arrow 164, and power pack 144 remains coupled to regulator 138, discharging itself to supply power to regulator 138. If power supply 136 has returned to at least the predetermined level 162, then power control flow diagram 130 branches back to state 132, as indicated by arrow 166.

Figure 9:
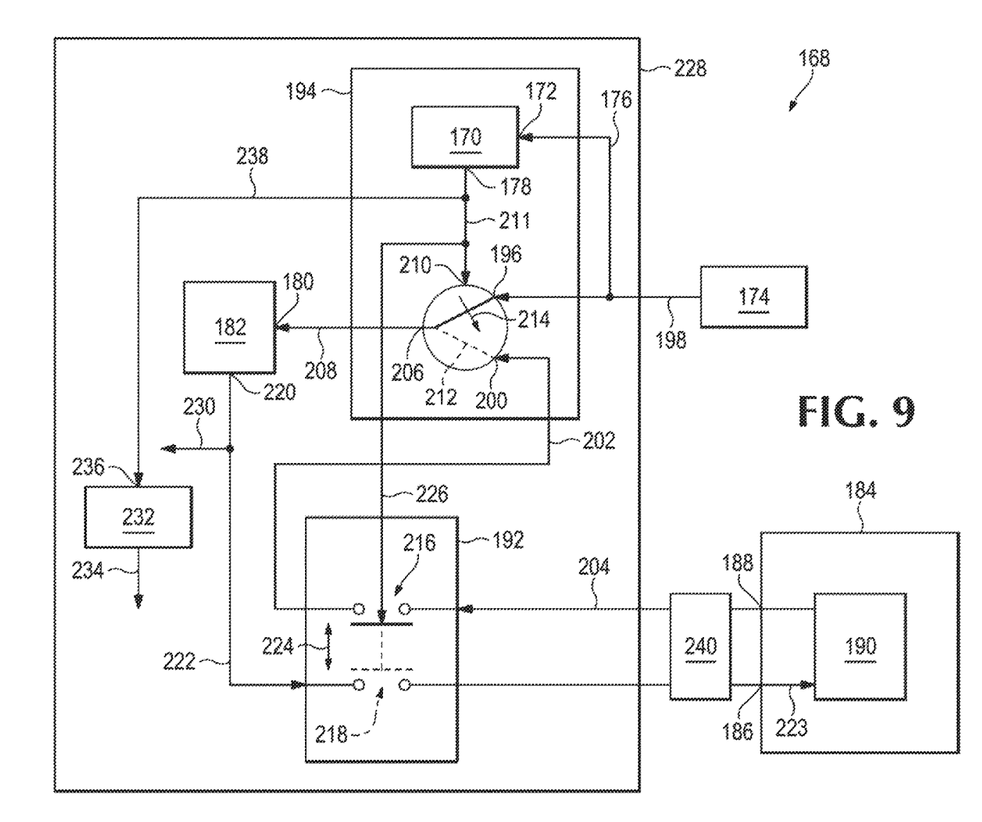
FIG. 9 is an example of a power control block diagram.

An example of a power control block diagram 168 is shown in FIG. 9. As can be seen in FIG. 9, power control block diagram 168 includes a power monitor 170 having an input 172 coupled to a power supply 174, as indicated by arrow 176, and an output 178. Power supply 74 may include an AC wall outlet and a power plug. Power monitor 170 monitors the supply of power to input 180 of regulator 182 from power supply 174. Power control block diagram 168 additionally includes a power pack 184 having an input 186 and an output 188. Power pack 184 provides an alternative to the use of a relatively more expensive and larger uninterruptable power supply (UPS). In this example, power pack 184 includes a rechargeable battery 190.

As can also be seen in FIG. 9, power control block diagram 168 additionally includes a flow control module 192 and a power source selector 194. Power source selector 194 includes a first input 196 coupled to power supply 174, as indicated by arrow 198, a second input 200 coupled to power pack output 188 via flow control module 192, as indicated by arrows 202 and 204, an output 206 coupled to regulator input 180, as indicated by arrow 208, and a control input 210 coupled to power monitor output 178, as indicated by arrow 211. Control input 210 allows power source selector 194 to selectively couple either power supply 174 to regulator input 180 via first input 196 and power source selector output 206, as shown, when power supply 174 is at least at a predetermined level or power pack output 188 to regulator input 180 via second input 200 and power source selector output 206, as indicated by movement of switch 212 in the direction of arrow 214 to the outlined position shown in FIG. 9, when power supply 174 is below this predetermined level.

As can also be seen in FIG. 9, flow control module 192 includes as first state 216 that couples power pack output 188 to regulator input 180 via power source selector 194, as described above. Flow control module 192 also includes a second state 218 (illustrated in outline) couple regulator output 220 to power pack input 186 to recharge power pack 184, as indicated by arrows 222 and 223. Flow control module 192 is controllably movable between first state 216 and second state 218, as indicated by double-headed arrow 224, by virtue of a connection with output 178 of power monitor 170, as indicated by arrow 226.

As can additionally be seen in FIG. 9, regulator 182 supplies power to an electronic device 228 (in this case a desktop computer), as indicated by arrow 230. This power can be in the form of a single voltage and single current, multiple voltages and a single current, a single voltage and multiple currents, or multiple voltages and multiple currents. Additionally, these voltages and currents can be in the form of direct current (DC), alternating current (AC), or a combination of the two.

As can further be seen in FIG. 9, power control block diagram 168 additionally includes an event generator 232 having an Advanced Configuration and Power Interface (ACPI) G1 Sleeping state output 234 and an input 236 coupled to power monitor output 178, as indicated by arrow 238. ACPI G1 Sleeping state output 234 is provided by event generator 232 when monitored power from power supply 174 fills below the predetermined level (as discussed above) so that power is supplied to regulator 182 by power pack 184. This allows desktop computer 228 to operate in a limited capacity so that data thereon is not corrupted and may be saved in the event of a loss of power from power supply 174.

As can still further be seen in FIG. 9, power monitor 170, regulator 182, flow control module 192, power source selector 194 and event generator 232 are all located within electronic device 228. This can be accomplished, for example, by including these items on a printed circuit board assembly (PCA) within desktop computer 228. Power pack 184 couples to electronic device 228 via a connector 240 which may include a universal serial bus connector (either type A or type B). Connector 240 allows power pack 184 to easy couple to and decouple from desktop computer 228 by utilizing readily available standard interfaces rather than specially designed and potentially more expensive custom interfaces.

Although several drawings have been described and illustrated in detail, it is to be understood that the same are intended by way of illustration and example. These implementations are not intended to he exhaustive or to be limited to the precise form disclosed. Modifications and variations may well be apparent. For example, power control circuit 62 and power control block diagram 168 may include other types of connectors (e.g., High-Definition Multimedia interface (HDMI), Firewire, Thunderbolt, Small Computer System interface (SCSI), etc.). As another example, power control block diagram 168 may additionally include a processor and non-volatile storage medium having instructions that are executable by the processor. This processor and/or non-volatile storage medium may be part of power monitor 170, flow control module 192 and/or power source selector 194. In other examples, this processor and/or non-volatile storage medium may be separate from power monitor 170, flow control module 192, and power source selector 194. As an additional example, power control flow diagram 130 may be used to provide an example of the operation of power control block diagram 168. As a further example, power control circuit 62, method of controlling power 84, non-volatile storage medium 112, power control flow diagram 130 and/or power control block diagram 168 may include other or additional Advanced Configuration and Power Interface (ACPI) "Gx" states.

Additionally, reference to an element in the singular is not intended to mean one, unless explicitly so stated, but rather means at least one. Furthermore, unless specifically stated, any method elements or instructions on a non-volatile storage medium that are executed by a processor are not limited to the sequence or order described and illustrated. Moreover, no element or component is intended to he dedicated to the public regardless of whether the element or component is explicitly recited in the following claims.

What is claimed is:

1. A power control circuit, comprising:
   a regulator including an input;
   a power supply;
   a power monitor including an input coupled to the power supply and an output coupled to a power source selector, wherein the power monitor is to determine a power level supplied to the input of the regulator from the power supply;
   a power pack including an output;
   a flow control module including a first state to couple the power pack output to the regulator input; and
   the power source selector including a first input coupled to the power supply, a second input coupled to the power pack output via the flow control module, an output coupled to the regulator input, and a control input, coupled to the power monitor output, to:
      selectively couple, at the power source selector, the power supply to the regulator input via the first input and the power source selector output responsive to the power level determined by the power monitor being at least at a threshold level, and
      selectively decouple, at the power source selector, the power supply from the regulator input and selectively couple, at the power source selector, the power pack output to the regulator input via the second input and the power source selector output responsive to the power level determined by the power monitor being below the threshold level.

2. The power control circuit of claim 1, wherein the regulator includes an output, the power pack includes an input, and the flow control module includes a second state to couple the regulator output to the power pack input, wherein the flow control module is controllably moveable from the first state to the second state responsive to the power level determined by the power monitor returning to at least at the threshold level.

3. The power control circuit of claim 1, further comprising a connector to removably couple the power pack output to the flow control module.

4. The power control circuit of claim 1, further comprising an event generator including an Advanced Configuration and Power Interface (ACPI) G1 Sleeping state output and an input coupled to the power monitor output, wherein the event generator is to provide the G1 Sleeping state output responsive to the power level determined by the power monitor being below the threshold level.

5. The power control circuit of claim 1, wherein at least one of the power monitor, the flow control module, and the power source selector include a processor and further comprising a non-volatile storage medium including instructions relating to control of power that are executable by the processor.

6. The power control circuit of claim 1, wherein the power pack includes a rechargeable battery.

7. A method of controlling power, comprising:
   providing a supply of power from a power supply to a regulator;
   monitoring the supply of power to the regulator via a power monitor;
   coupling, at a flow control module, an output of the regulator to an input of a power pack to charge the power pack via the regulator responsive to a determination by the power monitor that the monitored supply of power is at least at a predetermined level;
   decoupling the supply of power from the regulator by decoupling a first input of a power source selector from a power source selector output responsive to a determination by the power monitor that the monitored supply of power is below the predetermined level;
   reconfiguring the flow control module to decouple the output of the regulator from the input of the power pack and couple an output of the power pack to an input of the power source selector to discharge the power pack to supply power to the regulator responsive to the determination by the power monitor that the monitored supply of power is below the predetermined level; and
   generating an Advanced Configuration and Power Interface (ACPI) G1 Sleeping state signal responsive to the determination by the power monitor that the monitored supply of power is below the predetermined level.

8. The method of claim 7, further comprising executing instructions on a non-volatile storage medium via a processor to at least one of monitor the supply of power from the power supply to the regulator, decouple the supply of power from the regulator responsive to the determination by the power monitor that the monitored supply of power is below the predetermined level, and generate the Advanced Configuration and Power Interface (ACPI) G1 Sleeping state output responsive to the determination by the power monitor that the monitored supply of power is below the predetermined level.

9. The method of claim 7, further comprising, recoupling the supply of power to the regulator by recoupling the first input of the power source selector to the power source selector output responsive to a determination by the power monitor that the monitored supply of power returns to the predetermined level.

10. The method of claim 9, further comprising executing instructions on a non-volatile storage medium via a processor to recouple the supply of power to the regulator by recoupling the first input of the power source selector to the power source selector output responsive to a determination by the power monitor that the monitored supply of power returns to the predetermined level.

11. The method of claim 7, further comprising, recharging the power pack from the regulator responsive to a determination by the power monitor that the monitored supply of power returns to the predetermined level.

12. The method of claim 7, further comprising removably connecting the power pack to the regulator.

13. A non-volatile storage medium comprising instructions relating to control of power that, when executed by a processor, cause the processor to:
- monitor, via a power monitor, a supply of power from a power supply to a regulator;
- couple the power supply to the regulator by coupling an input of a power source selector, connected to an output of the power supply, to a power source selector output coupled to an input of the regulator responsive to the power monitor detecting the monitored supply of power is at least at a predetermined level;
- decouple the power supply from the regulator by decoupling a first input of a power source selector from a power source selector output responsive to the power monitor detecting the monitored supply of power is below the predetermined level;
- couple an output of a power pack to a second input of the power source selector and couple the second input of the power source selector to the power source selector output connected to the regulator to supply power to the regulator responsive to the power monitor detecting the monitored supply of power is below the predetermined level; and
- generate an Advanced Configuration and Power Interface (ACPI) G1 Sleeping state signal responsive to the power monitor detecting the monitored supply of power is below the predetermined level.

14. The non-volatile storage medium of claim 13, further comprising instructions relating to the control of power that, when executed by a processor, cause the processor to:
- recouple the power supply to the regulator by recoupling the first input of the power source selector to a power source selector output coupled to an input of the regulator responsive to the power monitor detecting the monitored supply of power returns to the predetermined level; and
- decouple the power pack from the regulator by decoupling the output of the power pack from the second input of the power source selector to the power source selector output responsive to the power monitor detecting the monitored supply of power returns to the predetermined level so that the power pack may be recharged from the regulator.

15. The non-volatile storage medium of claim 13, further comprising instructions relating to the control of power that, when executed by a processor, cause the processor to recharge the power pack from the regulator responsive to the power monitor detecting the monitored supply of power returns to the predetermined level.

* * * * *

UNITED STATES PATENT AND TRADEMARK OFFICE
CERTIFICATE OF CORRECTION

PATENT NO. : 10,379,589 B2
APPLICATION NO. : 15/306674
DATED : August 13, 2019
INVENTOR(S) : Patrick Ferguson et al.

Page 1 of 1

It is certified that error appears in the above-identified patent and that said Letters Patent is hereby corrected as shown below:

On the Title Page

Item (57), Abstract, in Column 2, Line 4, delete "decouple supply" and insert
-- decouple the supply --, therefor.

Signed and Sealed this
Nineteenth Day of November, 2019

Andrei Iancu
*Director of the United States Patent and Trademark Office*